(12) United States Patent
Lee et al.

(10) Patent No.: US 11,166,365 B2
(45) Date of Patent: Nov. 2, 2021

(54) PRINTED CIRCUIT BOARD AND MANUFACTURING METHOD FOR THE SAME

(71) Applicant: Samsung Electro-Mechanics Co., Ltd., Suwon-si (KR)

(72) Inventors: A-ran Lee, Suwon-si (KR); Kee-Ju Um, Suwon-si (KR); Ju-Ho Kim, Suwon-si (KR); Myeong-Hui Jung, Suwon-si (KR); Kyuong-Hwan Lim, Suwon-si (KR); Jin-Won Lee, Suwon-si (KR); Seung-On Kang, Suwon-si (KR); Jong-Guk Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/663,397

(22) Filed: Oct. 25, 2019

(65) Prior Publication Data
US 2020/0170102 A1     May 28, 2020

(30) Foreign Application Priority Data
Nov. 26, 2018    (KR) .................. 10-2018-0147408

(51) Int. Cl.
*H05K 1/02*      (2006.01)
*H05K 1/09*      (2006.01)
(Continued)

(52) U.S. Cl.
CPC ............. *H05K 1/0206* (2013.01); *H05K 1/09* (2013.01); *H05K 1/113* (2013.01); *H05K 3/06* (2013.01);
(Continued)

(58) Field of Classification Search
CPC ........ H05K 1/0206; H05K 3/06; H05K 1/113; H05K 1/09; H05K 3/428;
(Continued)

(56) References Cited

U.S. PATENT DOCUMENTS 4,911,796 A *   3/1990   Reed .................... H05K 3/0008
                                                        205/125
6,740,221 B2 *   5/2004   Cheung .................... C25D 3/38
                                                        205/104

(Continued)

FOREIGN PATENT DOCUMENTS

JP         2007-324182 A    12/2007
KR     10-0925189 B1    11/2009
(Continued)

OTHER PUBLICATIONS

Korean Office Action dated Jan. 18, 2020 in corresponding Korean Patent Application No. 10-2018-0147408 (5 pages in English, 5 pages in Korean).

*Primary Examiner* — Ishwarbhai B Patel
(74) *Attorney, Agent, or Firm* — NSIP Law

(57) ABSTRACT

A printed circuit board includes: a first insulating layer; and a heat radiating circuit pattern disposed on a first surface of the first insulating layer and having a pad and a via. The heat radiating circuit pattern includes: a first metal layer disposed on the first insulating layer; a graphite layer disposed on the first metal layer; and a second metal layer disposed on the graphite layer.

6 Claims, 4 Drawing Sheets

(51) Int. Cl.
*H05K 1/11* (2006.01)
*H05K 1/18* (2006.01)
*H05K 3/42* (2006.01)
*H05K 3/06* (2006.01)

(52) U.S. Cl.
CPC ..... *H05K 3/428* (2013.01); *H05K 2201/0323* (2013.01); *H05K 2201/0338* (2013.01); *H05K 2203/072* (2013.01); *H05K 2203/0723* (2013.01)

(58) Field of Classification Search
CPC ..... H05K 2203/0723; H05K 2203/072; H05K 2201/0323; H05K 2201/0338
See application file for complete search history.

(56) References Cited

U.S. PATENT DOCUMENTS

| | | | |
|---|---|---|---|
| 7,479,013 B2 * | 1/2009 | Takezaki | H05K 1/0207 361/751 |
| 2012/0261166 A1 * | 10/2012 | Oh | H05K 3/4608 174/252 |
| 2014/0027163 A1 * | 1/2014 | Min | H05K 3/4605 174/257 |
| 2016/0249445 A1 * | 8/2016 | Min | H05K 1/181 |
| 2016/0309575 A1 * | 10/2016 | Min | H05K 1/0204 |
| 2018/0090451 A1 * | 3/2018 | Matsubara | H01L 23/49822 |

FOREIGN PATENT DOCUMENTS

| | | |
|---|---|---|
| KR | 10-2012-0117456 A | 10/2012 |
| KR | 10-2015-0030743 A | 3/2015 |
| WO | WO 2014/003799 A1 | 1/2014 |

* cited by examiner

PRINTED CIRCUIT BOARD AND MANUFACTURING METHOD FOR THE SAME

CROSS-REFERENCE TO RELATED APPLICATION

This application claims the benefit under 35 USC 119(a) of Korean Patent Application No. 10-2018-0147408, filed on Nov. 26, 2018, entitled "PRINTED CIRCUIT BOARD AND MANUFACTURING METHOD FOR THE SAME", the entire disclosure of which is hereby incorporated by reference for all purposes.

BACKGROUND

1. Technical Field

The following description relates to a printed circuit board and a manufacturing method for the same.

2. Description of the Background

As an electronic device such as a mobile device, a laptop computer, etc. becomes smaller and thinner, an electronic element mounted on a printed circuit board has higher capacity and higher integration to generate a large amount of heat.

Therefore, there is a growing need for a printed circuit board which may rapidly radiate the heat generated from the electronic element.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: a first insulating layer; and a heat radiating circuit pattern disposed on a first surface of the first insulating layer and having a pad and a via. The heat radiating circuit pattern includes: a first metal layer disposed on the first insulating layer; a graphite layer disposed on the first metal layer; and a second metal layer disposed on the graphite layer.

The printed circuit board may include a first circuit pattern formed on a second surface of the first insulating layer opposite the first surface, and the graphite layer may form a heat transfer path along a via land, a via hole and the first circuit pattern in the via.

The first metal layer may connect the via land, the via hole and the first circuit pattern together in the via, and the first metal layer, the graphite layer, and the second metal layer may fill the via hole The printed circuit board may include an electronic element mounted on the first insulating layer and connected to the pad.

The printed circuit board may include a solder resist layer disposed on the first surface of the first insulating layer and exposing the pad; a second insulating layer disposed on a second surface of the first insulating layer opposite the first surface; and a second circuit pattern disposed on the second insulating layer.

In another general aspect, a manufacturing method for a printed circuit board includes: forming a via hole in a first insulating layer; forming a heat radiating layer by sequentially stacking a first metal layer, a graphite layer and a second metal layer on the via hole and the first insulating layer; and forming a heat radiating circuit pattern by selectively removing the heat radiating layer.

Forming of the heat radiating layer may include forming the graphite layer by sputtering carbon particles on an entire surface of the first metal layer, and forming of the heat radiating circuit pattern may include selectively removing the first metal layer, the graphite layer and the second metal layer.

Forming of the heat radiating layer may include forming the graphite layer corresponding to the heat radiating circuit pattern by selectively sputtering carbon particles on the first metal layer, and forming of the heat radiating circuit pattern may include selectively removing the first metal layer and the second metal layer.

Forming of the heat radiating layer may include forming the first metal layer on the via hole and the first insulating layer by electroless plating, and forming the second metal layer on the first insulating layer or the graphite layer by electroplating.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
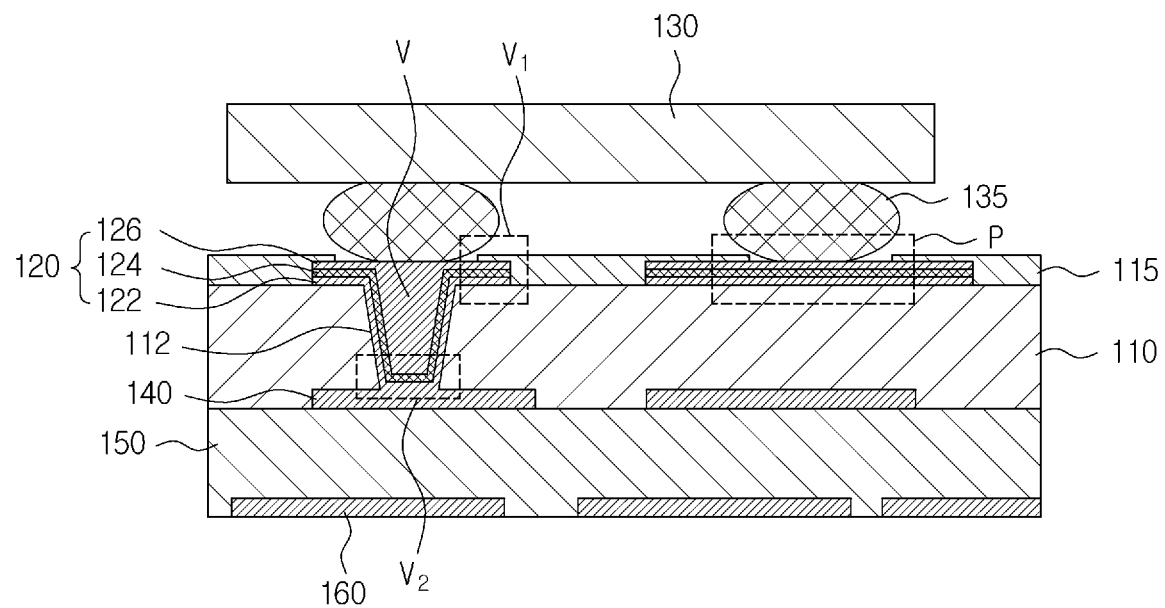
FIG. 1 is a view illustrating a printed circuit board according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating a printed circuit board according to an example.

Referring to FIG. 1, a printed circuit board may include a first insulating layer 110 and a heat radiating circuit pattern 120.

The first insulating layer 110 may be formed by stacking insulating materials, and the heat radiating circuit pattern 120 may be formed on the first insulating layer 110. A via hole 112 in which a via V is filled may be formed in the first insulating layer 110 for interlayer connection of the heat radiating circuit pattern 120 and another circuit pattern.

Referring to FIG. 1, the first insulating layer 110 may be an outermost insulating layer, and an electronic element 130 may be mounted on the first insulating layer 110. The electronic element 130 may be connected to the heat radiating circuit pattern 120 formed on one surface of the first insulating layer 110.

A solder resist layer 115 may be formed on the one surface of the first insulating layer 110 and may selectively expose a pad P, for example, of the heat radiating circuit pattern 120.

The first insulating layer 110 may be formed of various known insulating materials such as a thermosetting resin, a photosensitive resin, etc. The first insulating layer 110 may be formed of various reinforcing materials such as fibers, fillers, etc. in order to have improved mechanical characteristics such as strength, thermal expansion coefficient, etc. and electrical characteristics.

The heat radiating circuit pattern 120 may be formed on the one surface of the first insulating layer 110 and connected to the electronic element 130. To be connected with the electronic element 130, the heat radiating circuit pattern 120 may be formed on an outer surface of the first insulating layer 110 and may be provided with the pad P. The heat radiating circuit pattern 120 may have a structure in which a first metal layer 122, a graphite layer 124 and a second metal layer 126 are sequentially staked.

The first metal layer 122 may be stacked on the first insulating layer 110. The first metal layer 122 may serve to form a basic layout of the heat radiating circuit pattern 120 on the first insulating layer 110. The first metal layer 122 may be connected to another circuit pattern formed in an inner portion of the first insulating layer 110 or formed on the other surface of the first insulating layer 110.

The graphite layer 124 formed by stacking carbon particles may be stacked on the first metal layer 122 and serve to disperse heat. The graphite layer 124 may have a higher heat transfer characteristic than a metal and also have conductivity through which an electrical signal is transmitted. In particular, the graphite layer 124 may have a high heat transfer characteristic (about 500 W/mK) in a transverse direction (perpendicular to a stacking direction), and therefore may rapidly disperse and spread received heat over an entire surface of the heat radiating circuit pattern 120.

The second metal layer 126 may be stacked on the graphite layer 124. The second metal layer 126 may form an outer surface of the heat radiating circuit pattern 120 and may be connected to the electronic element 130 through a solder ball 135, for example.

Accordingly, the second metal layer 126 may receive heat from the electronic element 130, and transfer the received heat to the graphite layer 124. The graphite layer 124 may evenly disperse the heat over the entire surface of the heat radiating circuit pattern 120. The first metal layer 122 may then receive the dispersed heat from the graphite layer 124 and transfer the received heat to another circuit pattern connected to the first metal layer 122.

Accordingly, in the heat radiating circuit pattern 120, the second metal layer 126 may receive the heat and transfer the received heat mainly in a longitudinal direction to rapidly transfer a large amount of heat to the graphite layer 124, and the graphite layer 124 may transfer the received heat mainly in the transverse direction to evenly disperse the heat. The first metal layer 122 may then receive the dispersed heat and transfer the received heat mainly in the longitudinal direction, so that the heat is transferred to a circuit pattern on another layer. In this manner, the heat from the electronic element 130 may be effectively radiated.

Referring to FIG. 1, the heat radiating circuit pattern 120 may be provided with the pad P connected to the electronic element 130 through the solder ball 135. The heat generated from the electronic element 130 and then transferred to the second metal layer 126 in the pad P may be rapidly dispersed to the entire heat radiating circuit pattern 120 through the graphite layer 124 and the first metal layer 122.

The heat radiating circuit pattern 120 may be provided with the via V connected to a first circuit pattern 140 formed on the other surface of the first insulating layer 110. For example, an end portion V1 of the via V may be coupled with the first circuit pattern 140. In this case, the graphite layer 124 may have a heat transfer path along a via land V2, the via hole 112 and the first circuit pattern 140 in the via V. That is, a rapid heat transfer path may be formed by a via V structure directed from the one surface to the other surface of the first insulating layer 110 through an inner wall of the via hole 112. The graphite layer 124 may have a rapid heat transfer in the transverse direction (perpendicular to the stacking direction). Therefore, when the graphite layer 124 is curved so that the one surface of the first insulating layer 110 is continuously connected to the other surface thereof, the heat may be rapidly transferred from the one surface to the other surface of the first insulating layer 110.

Referring to FIG. 1, the first metal layer 122 may be stacked on the first insulating layer 110 and connect the via land V2, the via hole 112 and the first circuit pattern 140 together in the via V of the heat radiating circuit pattern 120. The graphite layer 124 may be stacked on the first metal layer 122 to have a heat transfer path in which the graphite layer 124 passes along the via land V2, the via hole 112 and the first circuit pattern 140. The second metal layer 126 may be stacked on the graphite layer 124 and fill the via hole 112. Here, as the electronic element 130 is connected to the second metal layer 126 through the solder ball 135, the via V may serve as the pad P.

The printed circuit board may further include a second insulating layer 150 and a second circuit pattern 160.

Referring to FIG. 1, the second insulating layer 150 may be an insulating layer stacked on the other surface of the first insulating layer 110. The second insulating layer 150 may be an inner layer of a build-up layer in which the first insulating layer 110 is an outermost layer, and otherwise may be an outer layer opposite to the first insulating layer 110. The second circuit pattern 160 may be formed on the second insulating layer 150 and may be connected to the first circuit pattern 140 and/or the heat radiating circuit pattern 120.

Figure 2:
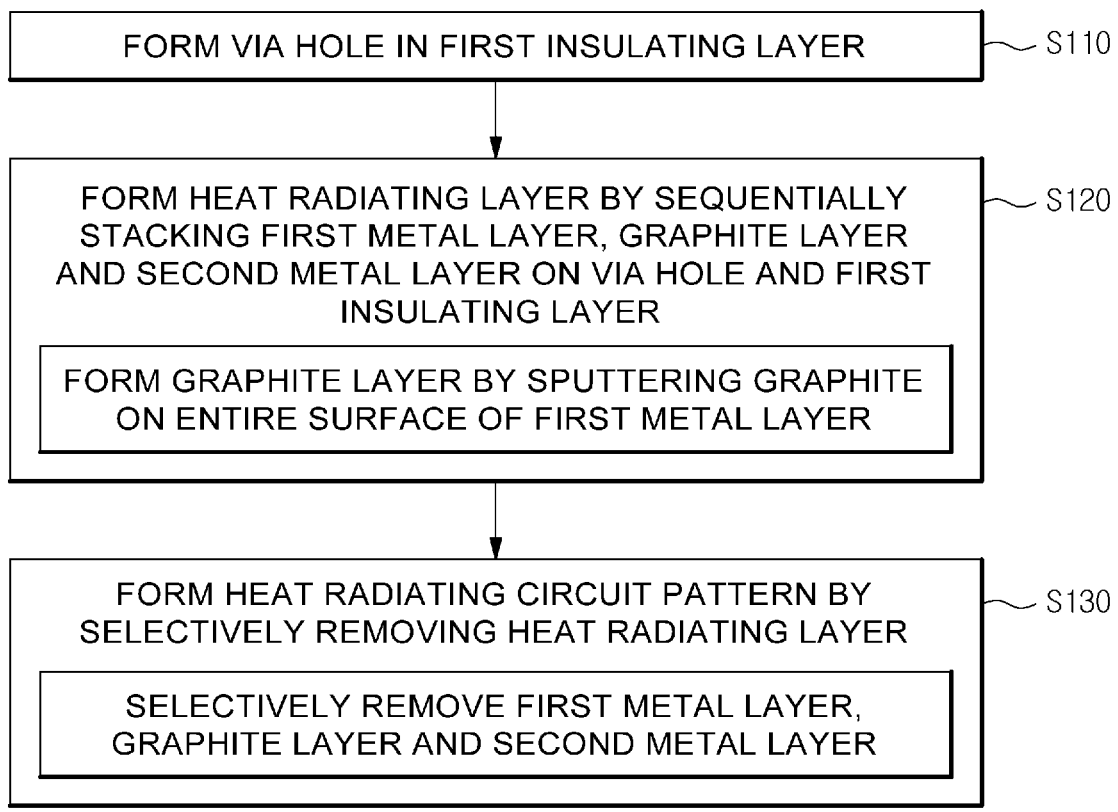
FIG. 2 is a flow chart illustrating a manufacturing method for a printed circuit board according to an example.

FIG. 2 is a flow chart illustrating a manufacturing method for a printed circuit board according to an example. FIGS. 3 to 7 are views illustrating sequential processes of the manufacturing method for a printed circuit board according to an example.

Referring to FIGS. 2 to 7, a manufacturing method for a printed circuit board may include: forming a via hole 112 (S110); forming a heat radiating layer (S120); and forming a heat radiating circuit pattern 120 (S130).

The forming of the via hole 112 (S110) may include forming the via hole 112 in a first insulating layer 110.

Figure 3:
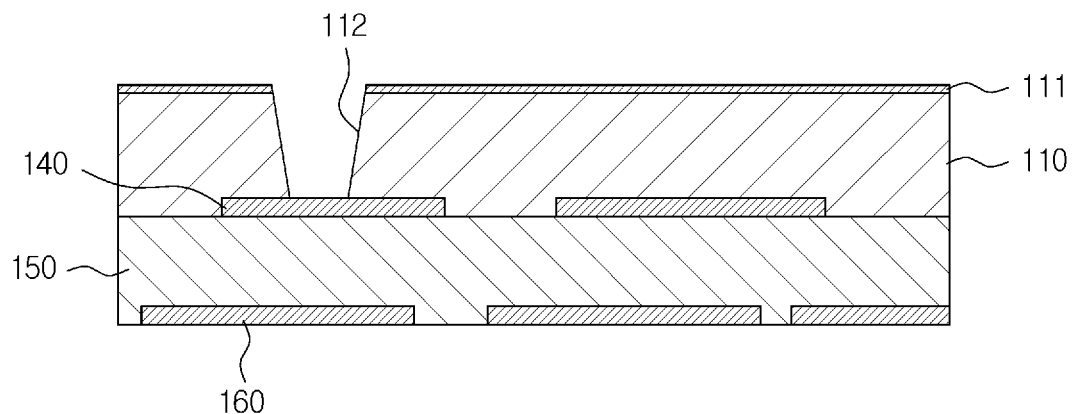
FIGS. 3, 4, 5, 6, and 7 are views illustrating sequential processes of a manufacturing method for a printed circuit board according to an example.

Referring to FIG. 3, a hole-processing may be performed on one surface of the first insulating layer 110 to form the via hole 112 exposing a first circuit pattern 140 formed on the other surface of the first insulating layer.

An insulating material formed of a metal laminate on which a metal foil 111 is formed may be used for the first insulating layer 110. The via hole 112 may penetrate through the metal foil 111 and the first insulating layer 110.

A second insulating layer 150 may be stacked on the other surface of the first insulating layer 110, and a second circuit pattern 160 may be formed on the second insulating layer 150.

Figure 4:
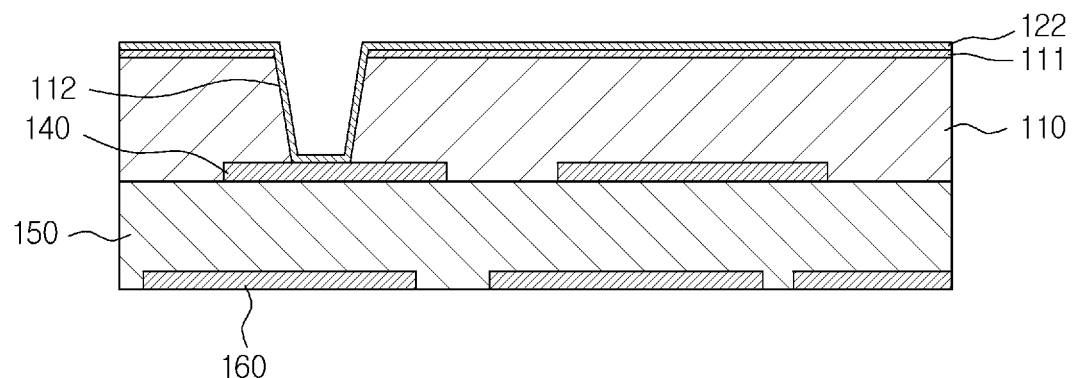
Figure 5:
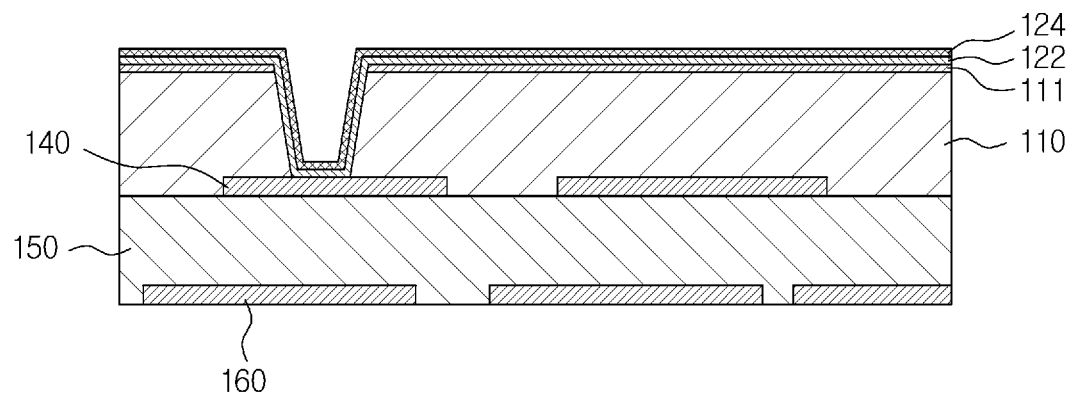
Figure 6:
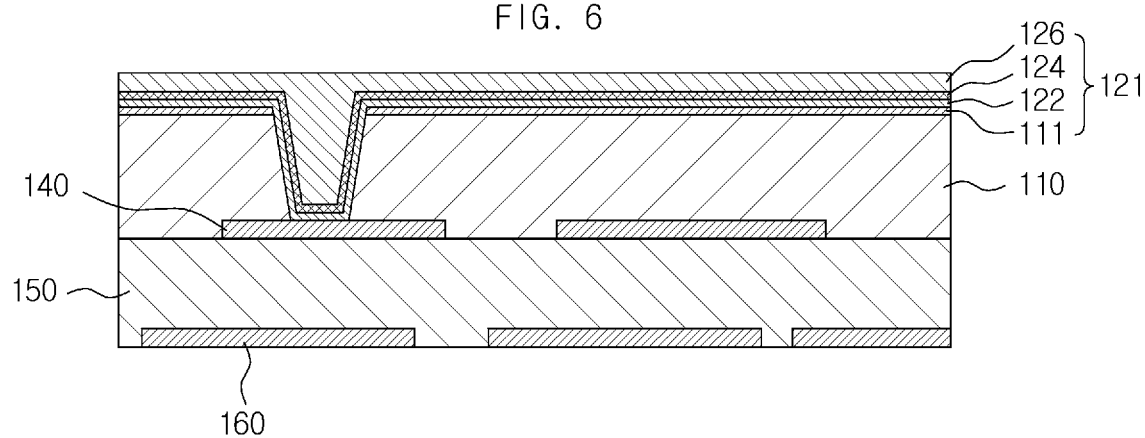

The forming of the heat radiating layer (S120) may include forming a heat radiating layer 121 by sequentially stacking a first metal layer 122, a graphite layer 124 and a second metal layer 126 on the via hole 112 and the first insulating layer 110 (as shown in FIGS. 4-6).

Referring to FIG. 4, the first metal layer 122 may be formed on an inner wall of the via hole 112 and on the one surface of the first insulating layer 110. When the metal foil 111 is formed on the first insulating layer 110, the first metal layer 122 may be formed on the metal foil 111. The first metal layer 122 may be formed by electroless plating.

Referring to FIG. 5, the graphite layer 124 may be formed by stacking carbon particles on the first metal layer 122. The graphite layer 124 may be formed by sputtering carbon particles on an entire surface of the first metal layer 122. The graphite layer 124 may continuously pass along the one surface of the first insulating layer 110, the inner wall of the via hole 112 and an end portion of a via, similar to the first metal layer 122.

Referring to FIG. 6, the second metal layer 126 may be formed on the graphite layer 124. The second metal layer 126 may be formed on the graphite layer 124 by electroplating. The graphite layer 124 has conductivity, and may thus stack the second metal layer 126 thereon through electroplating.

The forming of the heat radiating circuit pattern 120 (S130) may include forming the heat radiating circuit pattern 120 by selectively removing the heat radiating layer 121.

Figure 7:
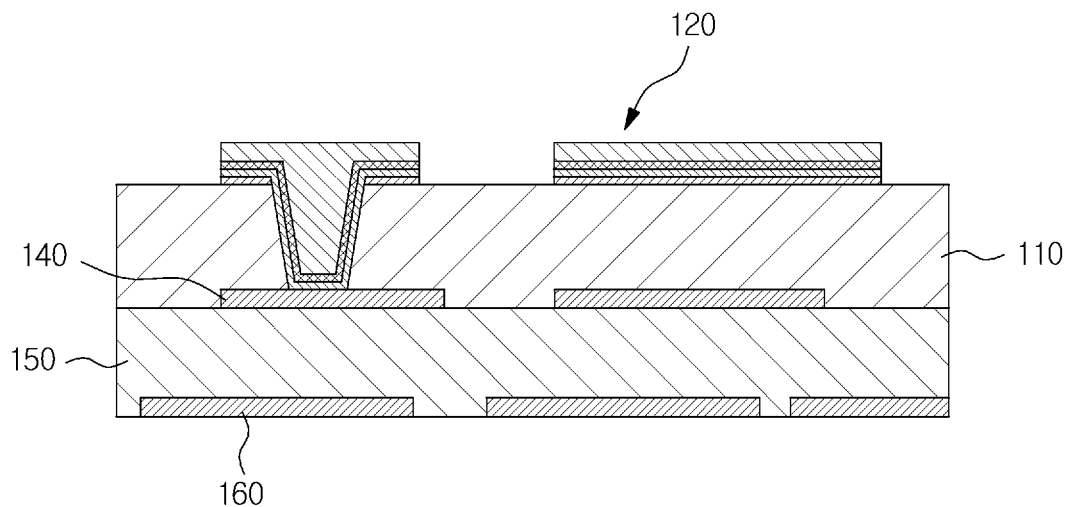

Referring to FIG. 7, the heat radiating circuit pattern 120 may be formed by selectively removing the heat radiating layer 121 formed on an entire surface of the first insulating layer 110. Here, a single etching solution may be used to simultaneously remove the first metal layer 122, the graphite layer 124 and the second metal layer 126. Alternatively, separate etching solutions respectively etching the first metal layer 122, the graphite layer 124 and the second metal layer 126 may be used to sequentially remove the second metal layer 126, the graphite layer 124 and the first metal layer 122.

The graphite layer 124 may be formed by selectively performing sputtering.

The forming of the heat radiating layer 121 may include forming the graphite layer 124 corresponding to the heat radiating circuit pattern 120 by selectively sputtering carbon particles on the first metal layer 122. That is, carbon particles may be sputtered only on a portion where the heat radiating circuit pattern 120 is to be formed.

The second metal layer 126 may be formed on the graphite layer 124 and a portion of the first metal layer 122 on which the graphite layer 124 is not formed. Here, the second metal layer 126 may be formed by electroplating.

The forming of the heat radiating circuit pattern 120 may include selectively removing the first metal layer 122 and the second metal layer 126 without separately etching the graphite layer 124.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a first insulating layer; and
a heat radiating circuit pattern disposed on a first surface of the first insulating layer and comprising a pad and a via,
wherein the heat radiating circuit pattern comprises:
a first metal layer disposed on the first insulating layer;
a heat dispersing layer consisting of graphite disposed on the first metal layer; and
a second metal layer disposed directly on the heat dispersing layer, and
wherein the second metal layer is exposed onto the first surface of the first insulating layer, and
wherein the second metal layer is in direct contact with at least one solder ball which is disposed above the via.

2. The printed circuit board of claim 1, further comprising a first circuit pattern formed on a second surface of the first insulating layer opposite the first surface,
wherein the heat dispersing layer forms a heat transfer path along a via land, a via hole and the first circuit pattern in the via.

3. The printed circuit board of claim 2,
wherein the first metal layer connects the via land, the via hole and the first circuit pattern together in the via; and
the first metal layer, the heat dispersing layer, and the second metal layer fill the via hole.

4. The printed circuit board of claim 1, further comprising an electronic element mounted on the first insulating layer and connected to the pad.

5. The printed circuit board of claim 1, further comprising:
a solder resist layer disposed on the first surface of the first insulating layer and exposing the pad;
a second insulating layer disposed on a second surface of the first insulating layer opposite the first surface; and
a second circuit pattern disposed on the second insulating layer.

6. A printed circuit board comprising:
a first insulating layer; and
a heat radiating circuit pattern comprising a via, and disposed on a first surface of the first insulating layer,
wherein the heat radiating circuit pattern comprises:
a first metal layer disposed on the first insulating layer;
a heat dispersing layer consisting of graphite disposed on the first metal layer; and
a second metal layer disposed directly on the heat dispersing layer,
wherein the second metal layer is exposed onto the first surface of the first insulating layer, and
wherein the second metal layer is in direct contact with at least one solder ball which is disposed above the via.

* * * * *